United States Patent
Ahn

[19]

[11] Patent Number: 6,083,833
[45] Date of Patent: Jul. 4, 2000

[54] METHOD FOR FORMING CONDUCTIVE FILM FOR SEMICONDUCTOR DEVICE

[75] Inventor: Min Su Ahn, Daeku, Rep. of Korea

[73] Assignee: LG Semicon Co., Ltd., Choongcheongbuk-Do, Rep. of Korea

[21] Appl. No.: 09/097,680

[22] Filed: Jun. 16, 1998

[30] Foreign Application Priority Data

Jul. 2, 1997 [KR] Rep. of Korea ........................ 97-30596

[51] Int. Cl.[7] .................................................. H01L 21/44
[52] U.S. Cl. .......................... 438/674; 438/507; 438/509; 438/550; 438/565; 438/568; 438/680
[58] Field of Search .................................. 438/565, 566, 438/568, 674, 680, 507, 508, 509, 550

[56] References Cited

U.S. PATENT DOCUMENTS

| 5,049,524 | 9/1991 | Kuo et al. ................................ 438/568 |
| 5,192,708 | 3/1993 | Beyer et al. ............................ 438/361 |
| 5,234,869 | 8/1993 | Mikata et al. .......................... 438/793 |
| 5,480,300 | 1/1996 | Okoshi et al. .......................... 432/241 |
| 5,567,152 | 10/1996 | Morimoto ............................... 432/241 |
| 5,813,851 | 9/1998 | Nakao ....................................... 432/6 |

*Primary Examiner*—Carl Whitehead, Jr.
*Assistant Examiner*—Khanh Duong

[57] ABSTRACT

A method for forming a conductive film for a semiconductor device wherein a conductive film is formed on each wafer loaded in a boat of a vertical furnace of a low pressure chemical vapor deposition apparatus provided with a chamber, a reaction tube in a center portion of the chamber, a boat loaded in the reaction chamber and a heater surrounding the chamber. The method includes a decompression step for reducing pressure in the chamber to a vacuum condition, a deposition step for depositing a conductive film on each wafer by introducing reaction gas into the chamber in the vacuum condition, a purge step for removing from the chamber toxic gas generated in the deposition step, and a normal pressure step for increasing pressure and temperature in the chamber, wherein the pressure increases from the normal pressure step and the temperature increases from the purge step. The method obtains deposition films of high quality which have similar properties since the conductive film deposited on each wafer in an annealing process of the normal pressure step has little shrinkage.

12 Claims, 2 Drawing Sheets

METHOD FOR FORMING CONDUCTIVE FILM FOR SEMICONDUCTOR DEVICE

BACKGROUND OF THE INVENTION

1. Field of the Invention

The present invention relates to a semiconductor device, and more particularly to a method for forming a conductive film in a semiconductor fabrication process.

2. Discussion of the Background

Generally, a conductive film is formed by a low pressure chemical vapor deposition (LPCVD) process in a vertical furnace or a horizontal furnace. Here, the vertical furnace process will be described.

FIG. 1 is a schematic cross-sectional diagram of an internal structure of a vertical reaction furnace. As shown therein, a vertical furnace 10 is provided with: an outer reaction tube 13; an inner reaction tube 15 of high purity quartz material disposed within a central portion of the outer reaction tube 13; a boat 17 provided in the inner reaction tube 15 and loaded with a plurality of wafers; a heating coil unit 19 in which coils are wound around the outer reaction tube 13; and a plurality of temperature measuring sensors 21 which are disposed at one side of the furnace 10 for measuring the temperature of the outer reaction tube 13. The boat 17 is divided into four sectors 17a, 17b, 17c and 17d. Here, the boat 17 is not physically divided into four sectors, but when depositing a conductive film on each wafer in the vertical furnace 10, the temperature in the outer reaction tube 13 is differently distributed in accordance with each sector of the vertical furnace 10, thereby being divided into four sectors by thermal classification. Each temperature measuring sensor 21 is provided for measuring the temperature of each section and the heating coil unit 19 covers the outer reaction tube 13 for temperature control.

Now, a conventional method for forming a conductive film in the thusly provided furnace will be described referring to FIGS. 2A and 2B.

First, the boat 17 wherein a plurality of wafers are provided is loaded in the inner reaction tube 15 (S0). The next process will be described divided into a decompression step, a deposition step, a purge step and a normal pressure step.

In the decompression step (S1), the pressure in the outer reaction tube 13 is reduced from 760 torr to 90 pascal for 100–110 min., and the temperature thereof is maintained at 570° C.

In the deposition step (S2), after decompressing the outer reaction tube 13, $PH_3$ and $SiH_4$ are introduced from a lower part of the outer reaction tube 13 into the inner reaction tube 15 for depositing a conductive film on each wafer. Here, the temperature for the process is maintained at 570±10° C. and the pressure therefor is 950 pascal. Here, the time of the above process may be varied in accordance with the thickness of the conductive film to be deposited on the wafers, ranging between about 20 min. and 2 hours.

In the purge step (S3), in order to externally exhaust toxic gas which has been produced in the deposition step (S2), the outer reaction tube 13 is put under a vacuum by being drained and $N_2$ is introduced into the outer reaction tube 13, for thereby removing the toxic gas. Here, the pressure in the outer reaction tube 13 ranges between 90 pascal and a vacuum state.

Lastly, in the normal pressure step (S4), after the purge process has been completed, the pressure in the outer reaction tube 13 increases up to atmospheric pressure.

In the thusly provided furnace employing the LPCVD method, each conductive film deposited on the wafer has a different thickness across from the lower section of the reaction tube to the upper section thereof since the deposition gas is introduced into the lower part of the chamber, and thus the gas is more densely distributed in the lower section of the reaction tube, whereas in the upper section thereof the gas is more thinly distributed. Thus, in order to adjust the uniformity of the conductive film deposition, the temperature in the lower section of the reaction tube is lowered by about 10° C. compared to the upper section thereof.

The temperature control is accomplished by the heating coils disposed at an outer side of the chamber and adjusted by each temperature measuring sensor. The temperature control is divided by the four sectors for the convenience of the operation. The temperatures of the four sectors 17a, 17b, 17c and 17d are 570° C., 567° C., 563° C. and 560° C., respectively.

Although there is provided the method for obtaining a conductive film having a uniform thickness, a conductive film in a crystalline condition is deposited on the wafer in sector 17a, and a conductive film in a crystalline and amorphous condition is deposited on the wafer in sectors 17b and 17c, and a conductive film in an amorphous state is deposited on the wafer in sector 17d.

An annealing process is performed after the process for depositing the multi-crystalline silicon, for thus improving the reliability of the deposited film. However, due to the different conditions of the deposited films, the thickness of the amorphous film is shrunk during the annealing process, whereas the shrinkage of the crystalline deposited film is minute, and thus the thicknesses of the deposited films on each wafer of the sectors are formed differently from each other. Accordingly, the conventional method for forming a conductive film has a problem in that the deposited films have differences in properties such as resistance.

SUMMARY OF THE INVENTION

Accordingly, the present invention is directed to a method for forming a conductive film for a semiconductor device that obviates the problems in the prior art techinque.

An object of the present invention is to provide a method for forming a conductive film for a semiconductor device that obtains conductive films having a uniform condition by a weak annealing process after a purge step when depositing the conductive film on each wafer loaded in a boat in a furnace of a low pressure chemical vapor deposition apparatus.

Additional features and advantages of the invention will be made apparent from the description which follows.

To achieve these and other advantages, in a vertical furnace of a low pressure chemical vapor deposition apparatus provided with a chamber, a reaction tube disposed in a center portion of the chamber, a boat loaded in the reaction chamber and a heater surrounding the chamber, in accordance with the present invention there is provided a method for forming a conductive film on each wafer loaded in the boat which includes: a decompression step for reducing pressure in the chamber to a vacuum condition; a deposition step for depositing a conductive film on each wafer by introducing reaction gas into the chamber in the vacuum condition; a purge step for removing from the chamber toxic gas generated in the deposition step; and a normal pressure step for increasing pressure and temperature in the chamber, wherein the pressure increases from the normal pressure step and the temperature increases from the purge step.

BRIEF DESCRIPTION OF THE DRAWINGS

In the drawings:

FIGS. 2A and 2B are graphs of pressure and temperature illustrating a process of a conventional method for forming a conductive film in a semiconductor fabrication process, wherein FIG. 2A illustrates the change in temperature in accordance with time by each step of the method and FIG. 2B illustrates the change in pressure in accordance with a time by each step on a log scale.

DETAILED DESCRIPTION OF THE INVENTION

Reference will now be made in detail to the preferred embodiment of the present invention, an example of which is illustrated in the accompanying drawings.

Figure 3:
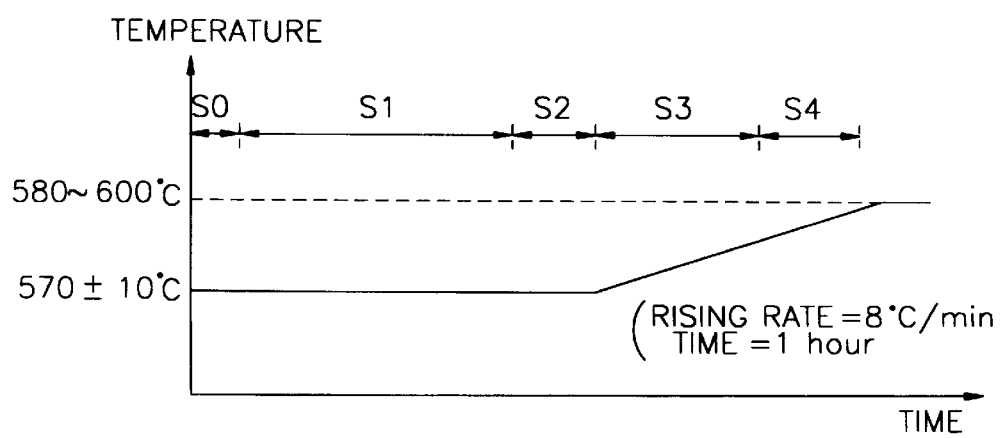
FIG. 3 is a graph illustrating the change in temperature in accordance with time by each step of the method for forming a conductive film in a semiconductor manufacturing process according to the present invention.

FIG. 3 is a graph illustrating the change in temperature in accordance with time by each step for explaining the method for forming a conductive film in a semiconductor manufacturing process according to the present invention (The change of pressure in accordance with time is identical to the conventional art, and thus description thereof will be omitted.).

Figure 1:
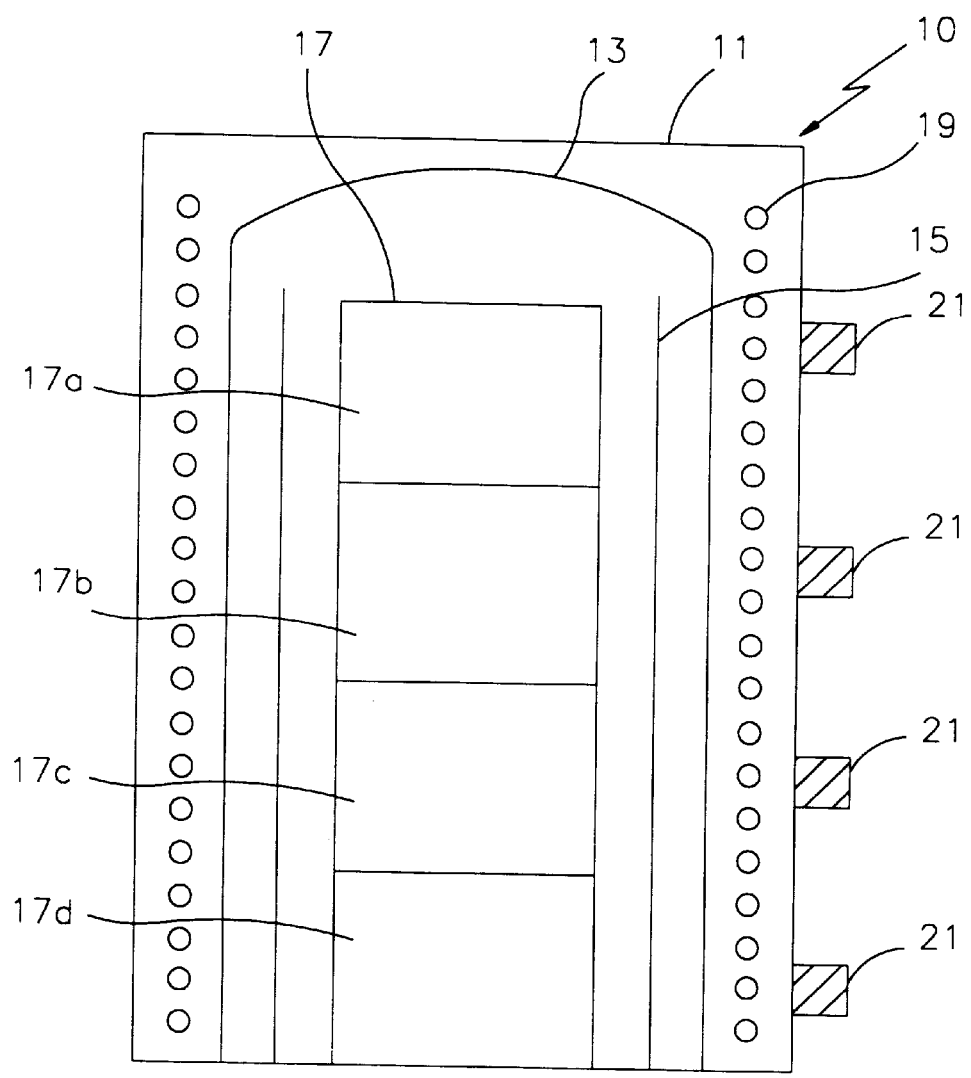
FIG. 1 is a cross-sectional diagram illustrating an internal structure of a furnace of a low pressure chemical vapor deposition apparatus.
Figure 2A:
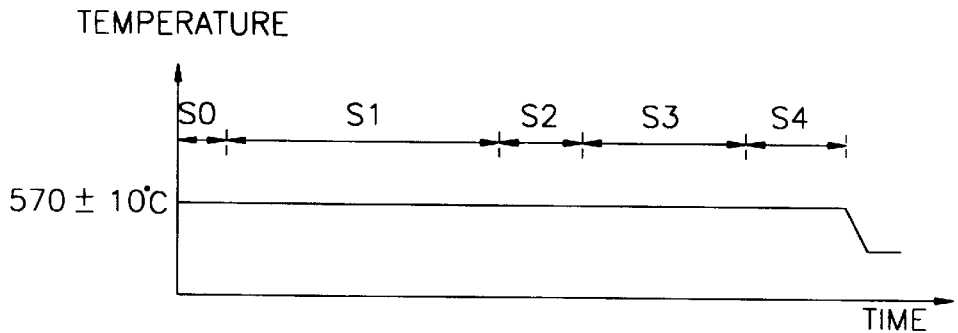
Figure 2B:
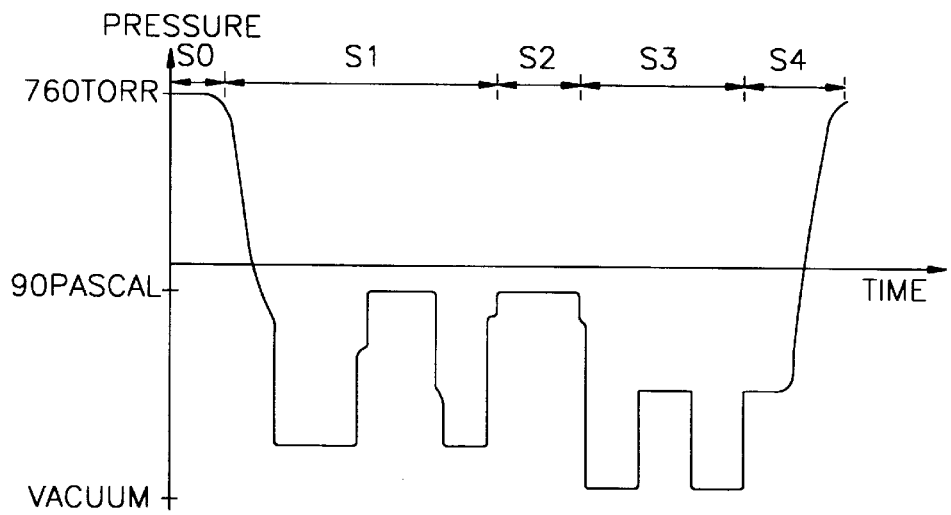

First, a boat 17 in which a plurality of wafers (not shown) are provided is loaded into the inner reaction tube 15 within the outer reaction tube 13 as shown in FIG. 1. Here, conditions of the outer reaction tube 13 in an initial step S0 are 760 torr pressure and 570±10° C. temperature.

It this step, the temperatures in the four sectors 17a, 17b, 17c and 17d of the boat 17 are differently adjusted within 570±10° C., because in the succeeding steps, that is a decompression step S1 and a deposition step S2, a conductive film is deposited on each wafer in the boat 17 in accordance with the flow of gas which is introduced from the lower part of the outer reaction tube 13 to the inner reaction tube 15.

Next, in the decompression step S1, the pressure is reduced from 760 torr to 90 pascal, the temperature is maintained as in the previous step and the time of the process is about 100 to 110 minutes.

In the deposition step S2, $PH_3$ and $SiH_4$, or $BF_2$ and $SiH_4$ are introduced from the lower part of the outer reaction tube 13 to the inner reaction tube 15 in order to deposit a conductive film on each wafer. Here, the temperature in the outer reaction tube 13 is maintained as in the previous step, the pressure is maintained at 90 pascal and the time of process may be varied dependent upon the desired thickness of each deposited conductive film, however, generally it ranges between 20 min. and 2 hours.

In a purge step S3, in order to externally exhaust toxic gas which has been produced in the deposition step S2, the outer reaction tube 13 is put in a vacuum state by being drained and $N_2$ is introduced thereinto, for thereby removing the toxic gas. Here, the pressure in the outer reaction tube 13 ranges between 90 pascal and a vacuum state.

Lastly, in a normal pressure step S4, a weak annealing process is applied to the conductive film deposited on each wafer in each sector of the boat 17, until the normal pressure step S4 is completed, by increasing the temperature of the outer reaction tube 13 in the process of increasing the pressure of the outer reaction tube 13 up to atmospheric pressure. Here, the temperature increasing rate of the outer reaction tube 13 is 8° C./min and the temperature increases up to 580–600° C. The temperature of each sector of the boat 17 increases at 80° C./min. That is, the temperature of sector 17d increases from 560 to 583° C. at 8° C/min, similarly sector 17c increases from 563 to 583° C., and 567 to 580° C. and 570 to 580° C. for sector 17b and 17a, respectively. Here, the time of process is required to be about 1 hour in order to complete a temperature stabilizing process and the annealing process.

Accordingly, in the method for forming the conductive layer according to the present invention, the annealing process is performed in the deposition chamber to achieve a homogeneous film when depositing poly-silicon on the wafer.

As described above, the method for forming the conductive film according to the present invention has several advantages.

First, when applying the annealing process to each deposited conductive film in each sector by increasing the temperature in the chamber after the deposition process for forming the conductive film on the wafer, the amorphous conductive film is crystallized, and thus the condition of each conductive film in sectors 17a, 17b, 17c and 17d becomes similar and the conductive film has little shrinkage, for thereby obtaining deposition films of high quality which have similar properties.

Second, sheet resistance can be decreased by crystallizing the condition of the conductive film deposited on the wafer.

Third, the reliability of the conductive film can be improved because the conductive film is uniformly deposited on the wafer.

It will be apparent to those skilled in the art that various modifications and variations can be made in the method for forming the conductive film for the semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming a conductive film on each wafer loaded in a boat in a vertical furnace of a low pressure chemical vapor deposition apparatus provided with an outer reaction tube, an inner reaction tube in a center portion of the outer reaction tube, a boat loaded in the inner reaction tube and a heater surrounding the outer reaction tube, the method comprising:

a decompression step for decompressing the outer reaction tube;

a deposition step for depositing a conductive film on each wafer by introducing reaction gas into the outer reaction tube;

a purge step for removing from the outer reaction tube toxic gas which has been produced in the deposition step; and a normal pressure step for increasing pressure and temperature of the outer reaction tube, wherein the pressure increases from the normal pressure step and the temperature increases from the purge step.

2. The method according to claim 1, wherein in the deposition step, the reaction gas introduced into the outer reaction tube is $PH_3$ and $SiH_4$.

3. The method according to claim 1, wherein in the deposition step, the reaction gas introduced into the outer reaction tube is $BF_2$ and $SiH_4$.

4. The method according to claim 1, wherein the conductive film is polysilicon doped with phosphorus or boron.

5. The method according to claim 1, wherein in the normal pressure step, the temperature in the outer reaction tube increases by 10 to 20° C., for thereby applying a weak annealing to the conductive film deposited on each wafer.

6. The method according to claim 5, wherein the temperature increasing rate in the outer reaction tube is 8° C./min.

7. The method according to claim 5, wherein the weak annealing is performed for about 1 hour.

8. The method according to claim 1, wherein in the deposition step, the boat is divided into four sectors by thermal classification.

9. The method according to claim 8, wherein a temperature of each sector of the boat is 570±10° C.

10. The method according to claim 8, wherein in the normal pressure step, each sector of the boat has the same temperature.

11. The method according to claim 10, wherein in the normal pressure step, the temperature in the outer reaction tube is about 580–600° C.

12. The method according to claim 1, wherein in the purge step, the pressure in the outer reaction tube is below 90 pascal.

* * * * *